United States Patent
Hsu

(10) Patent No.: US 6,667,872 B2
(45) Date of Patent: Dec. 23, 2003

(54) APPARATUS FOR MENDING FLUX-LEAKING GAP

(75) Inventor: Shi-Fa Hsu, Taipei (TW)

(73) Assignee: Mitac International Corp., Taoyuan (TW)

( * ) Notice: Subject to any disclaimer, the term of this patent is extended or adjusted under 35 U.S.C. 154(b) by 166 days.

(21) Appl. No.: 10/074,590

(22) Filed: Feb. 11, 2002

(65) Prior Publication Data

US 2003/0150632 A1 Aug. 14, 2003

(51) Int. Cl.$^7$ ................................................ H01H 47/00
(52) U.S. Cl. ................. 361/144; 174/35 R; 174/35 GC
(58) Field of Search ............................. 361/144, 816, 361/818; 174/35 R, 35 GC

(56) References Cited

U.S. PATENT DOCUMENTS

| 5,505,436 | A | * | 4/1996 | Roick | 267/107 |
| 6,206,543 | B1 | * | 3/2001 | Henry | 362/191 |
| 6,234,835 | B1 | * | 5/2001 | Bakker et al. | 439/553 |

* cited by examiner

Primary Examiner—Anthony Dinkins
(74) Attorney, Agent, or Firm—J.C. Patents

(57) ABSTRACT

A mending apparatus for a leakage flux gap, to mend a shield having an opening, so that the electromagnetic radiation source is completely circumscribed, and the electromagnetic wave does not emanate to external. The mending apparatus has an additional metal plate and an S-shape common clip. The S-shape common clip is used to connect the shield and the additional metal plate, so as to seal the opening. The additional metal plate and the shield can be inserted into two spaces of the S-shape clip to block the opening.

5 Claims, 2 Drawing Sheets

APPARATUS FOR MENDING FLUX-LEAKING GAP

BACKGROUND OF THE INVENTION

1. Field of the Invention

The invention relates in general to an apparatus to prevent electromagnetic interference (EMI), and more particularly, to an apparatus that has the flux-leaking gap mended to improve the prevention of electromagnetic interference.

2. Description of the Related Art

During the operation of an electrical or an electronic apparatus, electromagnetic radiation often emanates from several parts thereof, including the power source, the transmission conductive line and the electronic component. The emanating electromagnetic radiation results in an electromagnetic interference. The electromagnetic radiation may sometimes be so serious to affect the normal operation of other equipment. Therefore, how to prevent the equipment from being affected by the external electromagnetic interference and how to prevent the operation of equipment from generating electromagnetic interference are very challenging issues to various equipment.

The mechanism of electromagnetic interference prevention is not difficult by enclosing the electrical or electronic device with an appropriate shield, including the highly conductive metal such as copper and iron, or by connecting the electrical or electronic device to ground. The skin effect of the electromagnetic wave causes a part thereof traveling along the shield and gradually decaying. However, once the shield has any defect such as an opening, or once the device is not appropriately grounded, the electromagnetic wave emanates via the opening to cause leakage flux.

After being fabricated, the conventional structure that prevents electromagnetic wave has to be tested before practical application. The flux-leaking gap caused by poor design or imperfect assembly can be inspected. If any minor flux-leaking gap is found, a conductive tape or conductive paste can be applied for mending. Once the flux-leaking gap is too big to mend, the whole mold has to be fixed. The frequent fixture of the mold shortens the lifetime thereof. Sometimes the mold cannot even be fixed. Instead, a new mold has to be made. The formation of the flux-leaking gap is sometimes caused by using a common mold to fabricate the same products designed for different equipment. The different design for different equipment thus causes the formation of the flux-leaking gap.

FIG. 1 shows a shield 10 with a flux-leaking gap. The flux-leaking gap is in a form of an opening 12. FIG. 2 shows a conventional method to mend the flux-leaking gap. An additional metal plate 14 sized according to the dimension of the opening 12 is used to fill the opening 12. A conductive tape 16 is then used to adhere the joints between shield 10 and the metal plate 14, such that the metal plate 14 is fixed to the shield 10. The typical conductive tape 17 includes a paste of which the endurance of temperature variation is not high enough. When the electromagnetic radiation source is operating, the high temperature generated thereby causes the conductive tape 17 to peel off. In addition, the size of the metal plate 14 has to be adjusted according to the dimension of the opening 12.

In FIG. 3, another conventional method for mending the opening is shown. In FIG. 3, a metal plate 18 with a size larger than the opening 12 is required. The periphery of the metal plate 18 is cut into a plurality of legs. The alternate legs are bent, such that a vertical distance between the alternate bent and unbent legs can receive the shield 10 via the opening 12. That is, the opening 12 is filled with the metal plate 18. By this method, the problem for having the conductive tape peeling off from the shield is resolved. However, such structure is easily broken. A part of the electromagnetic wave stills radiate through gaps between the metal plate 18 and the shield 10. Further, the metal plate has to be designed according to the dimension of the opening 12.

SUMMARY OF THE INVENTION

The present invention provides a mending apparatus for a flux-leaking gap to enclose the electromagnetic radiation source. The mending apparatus that effectively mends the shield with an opening comprises an additional metal plate and an S-shape common clip. The S-shape common clip is used to connect the shield and the additional metal plate, so as to seal the opening. The S-shape common clip has a first end, a first turning part, a second turning part and a second end. The first turning part extends from the first end and has a turn with an angle of about 180°, while the second turning part extends from the second end and turns with an angle of about 180°. The first end and the second end are pointing towards opposing directions with the first and the second turning parts connected to each other therebetween. Thus constructed, the S-shape common clip has a first space and a second space open to two opposing directions formed by the first and the second turning parts. One side of the opening of the shield is thus received in one of the first and second spaces, while the additional metal plate is received in the other of the first and the second spaces. As a result, the additional metal and the shield are connected together without being affected by the temperature variation.

Both the foregoing general description and the following detailed description are exemplary and explanatory only and are not restrictive of the invention, as claimed.

DESCRIPTION OF THE PREFERRED EMBODIMENTS

To prevent from directly or indirectly affecting other equipment by the electromagnetic wave emanating during the operation of an electrical or electronic apparatus, a series of tests have to be performed to the product. However, electromagnetic wave emanating due to other design or assembly factors is inevitable during the testing processes. Therefore, the present invention provides a mending apparatus for flux-leaking gap to enhance the reliability of the mended flux-leaking gap without remodeling a new mold or fixing the existent mold.

Figure 1:
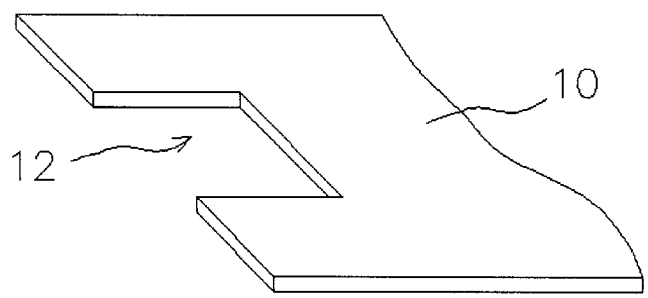
FIG. 1 shows a shield with a flux-leaking gap.
Figure 2:
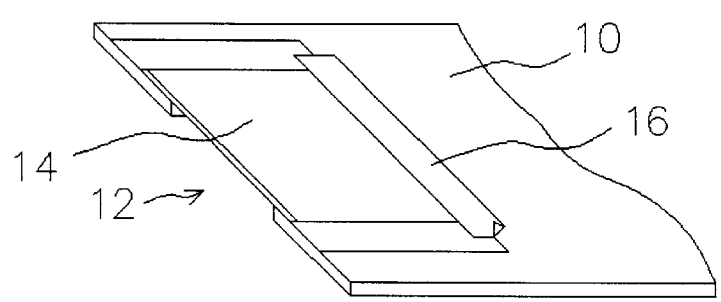
FIG. 2 shows a conventional mending apparatus for a shield with a flux-leaking gap.
Figure 3:
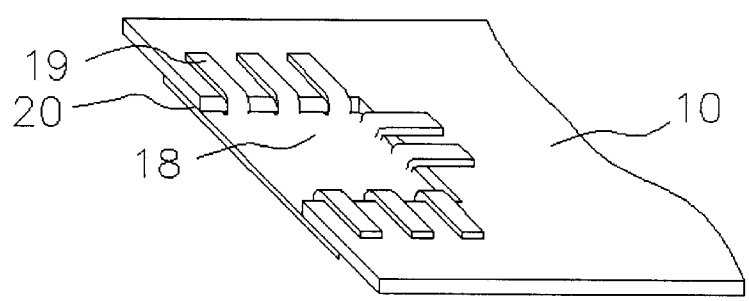
FIG. 3 shows another conventional mending apparatus for a shield with a flux-leaking gap.
Figure 4A:
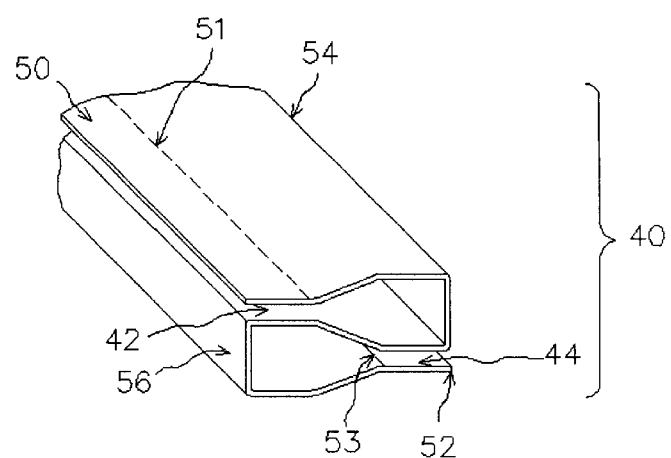
FIG. 4A shows an S-shape clip used in the mending apparatus for a shield with a flux-leaking gap according to the invention.
Figure 4B:
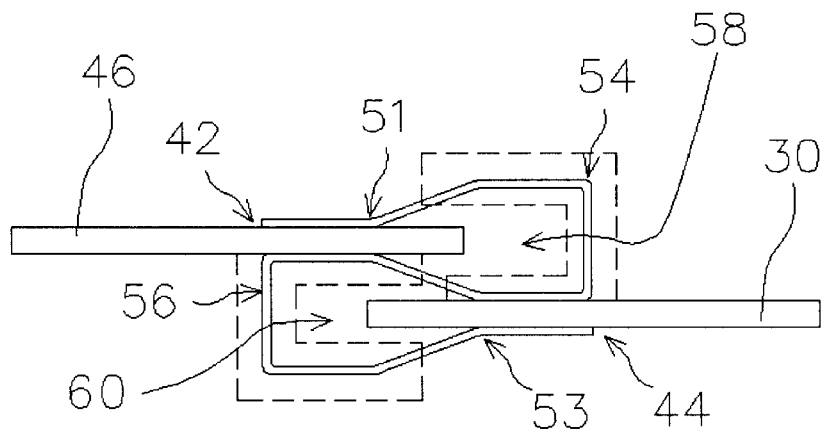
FIG. 4B shows the cross sectional view of the mending apparatus for a shield with a flux-leaking according to the invention.

FIG. 4A shows an S-shape common clip used in the mending apparatus for flux-leaking gap, and FIG. 4B shows the cross sectional view of the S-shape common clip.

Referring to FIGS. 4A and 4B, the S-shape common clip 40 is formed by directly bending a metal sheet. The cross sectional view of the bent metal sheet has an S shape. Being bent, the metal sheet has two ends 50, 52 opposing to each other and two turning parts 54, 56 connected to each other between these two ends 50 and 52. The turning part 54 extends from the first end 50 and is bent or turned with an angle of about 180°. The turning part 56 extends from the second end 52 makes an opposing turn with an angle of about 180°. Consequently, spaces 58 and 60 with openings 42 and 44 open to opposing directions are formed by the first and the second turning parts 54 and 56, respectively. A shield 30 and an additional metal plate 46 can thus be received in openings 42 and the 44. To increase the contact areas between the S-shape common clip 40 and the shield 30 and the additional metal plate 46, the sides 44 and 46 are further bent at the bending points 51 and 53, respectively. As shown in FIG. 4B, the contact areas between the S-shape common clip 30 and the shield 40 and the additional metal plate 46 are increased from line contact to surface contact. The clip strength is consequently increased.

As the shield 30 and the additional metal plate 46 can be fixed without reaching the innermost part of the spaces 56 and 58, the flexibility of the S-shape common clip 40 is improved. Further, the range for designing the dimension of the metal plate 46 is increased. Even if the metal plate 46 has a size different from that of the opening 32 of the shield 30, the metal plate 46 is still applicable. The precise measurement for cutting the metal plate 46 is not required. Therefore, the flux-leaking gap can be sealed efficiently during both the testing stage and the mass production stage.

The material of the S-shape common clip 40 includes a metal with a high conductivity such as copper and iron. While applying the S-shape common clip 40 to the shield 30, the connecting portions are preferably clean to avoid affecting the shielding effect by the paint or other material.

Figure 4C:
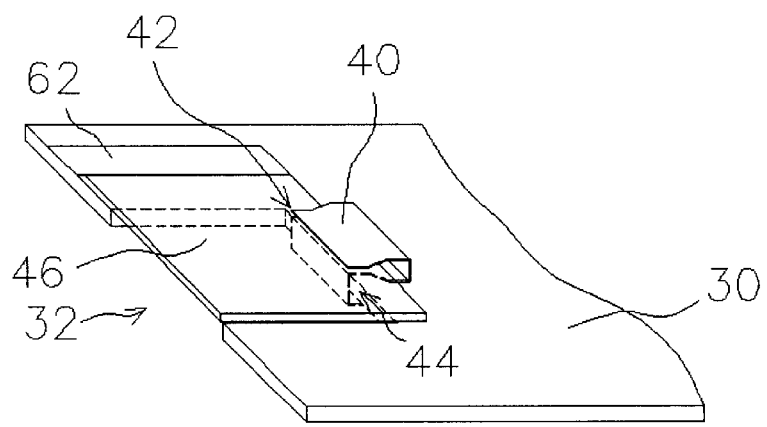
FIG. 4C shows a three-dimensional view of the mending apparatus for a shield with a flux-leaking according to the invention

FIG. 4C shows the three-dimensional view for applying the S-shape common clip 40 to connect the metal plate 46 and the shield 30. Referring to FIGS. 4A, 4B and 4C, the shield 30 includes an enclosure of an electrical or electronic apparatus to prevent electromagnetic interference. The opening 32 may be designed for the convenience of assembly or other reason. The opening 32 is easily to cause a leakage flux. Therefore, the present invention provides an S-shape common clip 40 to clip any side of the opening 32 via one of the openings 42 and 44. The number and dimension of the S-shape common clips 40 are adjusted according to specific requirement. The additional metal plate 46 is then inserted into the S-shape common clip 40 via the other opening 42 or 44 to seal the opening 32.

In the present invention, the metal plate 46 is connected to the shield 30 in face contact via the S-shape common clip 40, so that an improved sealing effect is obtained. Further, the conductive tape or paste can be used to provide a better sealing effect to the leakage flux gap.

In addition, the turning angles of the turning parts 54, 56 can be adjusted to vary the distance between the planes where the shield 30 and the metal plate 46 locate. As a result, the shield 30 and the metal plate 46 can be level at the same plane provided that the size of the metal plate 46 matches the dimension of the opening 32.

According to the above, the mending apparatus for leakage flux gap allows two apparatus to share the common mending apparatus for leakage flux gap without reopening a new mold. The cost is thus greatly reduced. In addition, the fabrication of the S-shape common clip is simple, and the dimension and number can be adjusted as required. The mending apparatus can be applied with the application of conductive tape or paste. As the mending apparatus is made of metal, one can easily adjust the structure thereof. The planarity of such structure can be maintained to a certain degree even under high temperature, so that the curling and peeling effect occurring to the conventional structure are avoided, while the electromagnetic interference is effectively prevented.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A mending apparatus for a flux-leaking gap, to mend a shield with an opening, so as to enclose an electromagnetic radiation source, the mending apparatus comprising:
    an additional metal plate, to block the flux-leakage gap; and
    an S-shape common clip, to connect the additional metal plate to the shield in order to seal the opening, further comprising:
        a first end;
        a first turning part, extending from the first end and turning with an angle of about 180°;
        a second turning part, extending from the first turning part and further turning with an angle of about 180°; and
        a second end, extending from the second turning part and pointing opposing to the first end; wherein
    a first space and a second space open to two opposing directions are formed by the first turning part and the second turning part, respectively, and one side of the opening of the shield being clipped in one of the first and the second spaces, while the additional metal plate is clipped within the other of the first and second spaces.

2. The mending apparatus according to claim 1, the S-shape common clip includes a metal sheet bent with an S cross-sectional shape.

3. The mending apparatus according to claim 1, wherein one of the opposing first and second spaces firmly receives the additional metal plate therein.

4. The mending apparatus according to claim 1, wherein the first turning part turns along a direction opposite to a direction that the second turning part turns.

5. The mending apparatus according to claim 1, further comprises a conductive tape applied to the opening of the shield to adhere the S-shape common clip and the additional metal plate.

* * * * *